United States Patent [19]
Akimoto et al.

[11] Patent Number: 5,994,941
[45] Date of Patent: *Nov. 30, 1999

[54] OPERATING VOLTAGE POINT COMPENSATION CIRCUIT FOR A TRANSISTORIZED CIRCUIT

[75] Inventors: Yo Akimoto; Norio Nagase; Yoshihiro Saito; Kakuji Inoue, all of Yokohama; Hiroyuki Nobuhara; Kazuyuki Mori, both of Kawasaki, all of Japan

[73] Assignee: Fujitsu Limited, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/757,624

[22] Filed: Nov. 27, 1996

[30] Foreign Application Priority Data

Jan. 30, 1996 [JP] Japan ..................... 8-013898

[51] Int. Cl.⁶ ..................................... H03L 5/00
[52] U.S. Cl. .......................................... 327/307; 327/362
[58] Field of Search ................... 327/307, 362, 327/538; 330/284

[56] References Cited

U.S. PATENT DOCUMENTS

| | | | |
|---|---|---|---|
| 4,163,947 | 8/1979 | Weedon | 327/307 |
| 4,734,598 | 3/1988 | Böhme | 327/362 |
| 4,868,519 | 9/1989 | Shafer | 330/284 |
| 4,890,014 | 12/1989 | Ramet | 327/307 |
| 4,943,736 | 7/1990 | Kihara et al. | 327/362 |
| 5,585,756 | 12/1996 | Wang | 327/307 |
| 5,600,275 | 2/1997 | Garavan | 327/307 |
| 5,651,073 | 7/1997 | Isu et al. | 330/284 |
| 5,659,264 | 8/1997 | Ariyoshi et al. | 327/307 |

*Primary Examiner*—Terry D. Cunningham
*Attorney, Agent, or Firm*—Staas & Halsey, LLP

[57] ABSTRACT

A transisterized circuit may be driven with a low voltage without saturation of a direct current operating voltage point. The transisterized circuit includes a first transisterized circuit formed by a cascade connection of a first differential transisterized circuit and a first emitter follower circuit, a second transisterized circuit formed by a cascade connection of a second emitter follower circuit and a second differential transistor circuit, and an inversion circuit connected between said first transisterized circuit and said second transistor circuit.

4 Claims, 5 Drawing Sheets

OPERATING VOLTAGE POINT COMPENSATION CIRCUIT FOR A TRANSISTORIZED CIRCUIT

BACKGROUND OF THE INVENTION

1. Field of the Invention

The present invention relates to an operating voltage point compensation circuit for a transistoried circuit. In particular, the present invention pertains to an operating voltage point compensation circuit that resolves a problem arising from the saturation of a direct current operating voltage point, which is the result of a power supply voltage change or a temperature change, in a low voltage drive circuit that is constituted by a transistorized circuit.

2. Description of the Related Art

Recently, various types of transistorized circuits driven at low voltages have been adopted to save power consumption. But when a transisterized circuit is driven at a low voltage of, for example, +3.3 V, a direct current operating voltage point may become saturated.

In FIG. 5 is shown an example of cascade connection by which differential transistors are coupled with emitter followers. Transistors TR1 and TR2, which are coupled differential transistors for which collector resistors R1 and R2 are respectively provided, have their emitters connected in common to a constant-current source and their collectors connected to the bases of the respective transistors TR3 and TR4, which serve as emitter follower circuits.

The emitters of the transistors TR3 and TR4 are connected to the bases of coupled differential transistors TR5 and TR6, and the emitters of the differential transistors TR5 and TR6 are connected in common to a transistor TR7.

Let us first consider a case where Vcc=+3.3 V. When Vcc=V1+V2+V3+3 Vbe, and when the base-emitter voltage Vbe of the transistor is 0.8 V (at junction point temperature Tj=25° C.), V1+V2+V3=0.9 V.

Therefore, in the case where, due to a voltage change, Vcc=+2.97 V (a 10% reduction), and due to a temperature change, Vbe=0.87 V (at junction point temperature Tj=−45° C.), "V1+V2+V3" yields a total of 0.36 V; and if V2=0 V, the total yield for "V1+V3" is only 0.36 V. Since the internal amplitude limit is approximately 0.2 V, an output may become saturated because of a variance in the circuit and an external change.

SUMMARY OF THE INVENTION

It is, therefore, one object of the present invention to resolve a problem that arises when a transisterized circuit becomes saturated because there is a change in the Vbe of the transistor, due to a temperature change, or because there is a power voltage fluctuation.

To achieve the object of the present invention, a first configuration for a compensation circuit, for an operating voltage point in a transistorized circuit, includes first and second transisterized circuits and an inversion circuit. The first transisterized circuit is formed by a cascade connection of a coupled differential transisterized circuit to an emitter follower circuit. The second transisterized circuit is formed by a cascade connection of an emitter follower circuit to a coupled differential transistor circuit. The inversion circuit is connected between the first transisterized circuit and the second transistor circuit.

According to a second configuration for an operating voltage point compensation circuit for a transisterized circuit of the present invention, the inversion circuit cited in the first configuration is an emitter-grounded transistor.

In addition, according to the present invention, a third configuration for an operating voltage point compensation circuit of a transisterized circuit includes first and second transistor circuits, a current supply circuit, a voltage detection circuit, and a comparison circuit. The second transistor circuit is connected to an output side of the first transistor circuit. The current supply circuit is connected to a connection point for the first transistor circuit and the second transistor circuit. The comparison circuit compares an output of the voltage change detection circuit with a reference voltage, whereby, in consonance with an output of the comparison circuit, a constant current is caused to flow across the current supply circuit.

Additionally, according to a fourth configuration for an operating voltage point compensation circuit of a transisterized circuit of the present invention, the first transisterized circuit cited in the third configuration has a coupled differential transisterized circuit and an emitter follower circuit connected thereto, and the second transisterized circuit consists of a coupled differential transistor circuit.

Furthermore, according to a fifth configuration of an operating voltage point compensation circuit for a transisterized circuit of the present invention, the reference voltage cited in the third configuration is a voltage that is generated by a zener diode to which a power voltage is to be supplied.

According to a sixth configuration of an operating voltage point compensation circuit for a transisterized circuit of the present invention, the current supply circuit cited in the third configuration constitutes a mirror circuit, and a current at one transistor that forms the mirror circuit is controlled by an output of the comparison circuit.

DETAILED DESCRIPTION OF THE PREFERRED EMBODIMENTS

Figure 1:
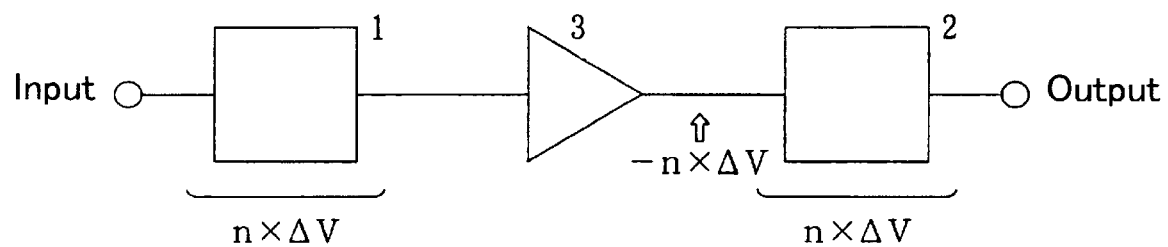
FIG. 1 is a diagram for explaining a first embodiment of the present invention.

The preferred embodiments of the present invention will now be described while referring to the accompanying drawings. Like or identical reference numerals are used to denote corresponding or identical components.

FIG. 1 is a diagram for explaining a first embodiment of the present invention for the resolution of a problem arising from a Vbe change at transistors that is due to temperature fluctuation.

Shown in FIG. 1 is a cascade connection of a first transisterized circuit 1 having n stages and a second transisterized circuit 2 having n stages. When a change in the base-emitter voltage Vbe at one transistor is assumed to be ΔV, the base-emitter voltage Vbe is changed by a value equivalent to n×ΔV in both the first transisterized circuit 1 and the second transisterized circuit 2.

In the first embodiment of the present invention, shown in FIG. 1, an inversion circuit 3 is provided between the first transisterized circuit 1 and the second transisterized circuit 2. The change n×ΔV in the base-emitter voltage Vbe that occurs at the first transisterized circuit 1 is inverted, and the resultant voltage is input to the second transisterized circuit 2.

In the second transisterized circuit 2, therefore, the input change n×ΔV of the base-emitter voltage Vbe is offset by an n×ΔV change that occurs in the second transisterized circuit 2. In this manner, the change in the base-emitter voltage Vbe is compensated for the cascade connected, first and second transisterized circuits 1 and 2.

Figure 2:
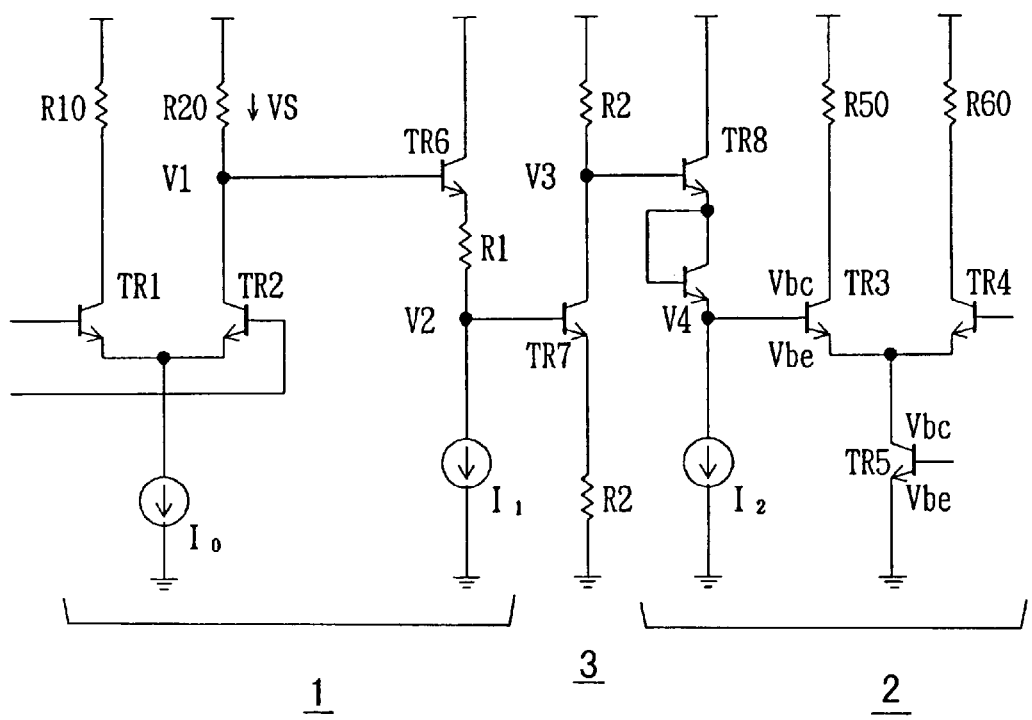
FIG. 2 is a specific circuit diagram illustrating the embodiment shown in FIG. 1.

FIG. 2 is a circuit diagram that corresponds to the explanatory diagram in FIG. 1 for the first embodiment of the present invention. Transistors TR1 and TR2, resistors R10 and R20, and a constant-current source $I_0$ constitute a first coupled differential transistorized circuit. Transistors TR3 and TR4, resistors R50 and R60, and a control transistor TR5 connected to a common emitter constitute a second coupled differential transistorized circuit.

An emitter follower circuit, including a transistor TR6, an emitter resistor R1 and a constant-current source $I_1$, is connected to the first coupled differential transistorized circuit. This arrangement constitutes the first transisterized circuit 1 shown in FIG. 1.

An emitter follower circuit, including transistors TR8 and TR4 and a constant-current supply $I_2$, is connected to the front stage of the second coupled differential transistor circuit. This arrangement provides the second transisterized circuit 2 shown in FIG. 2.

The inversion circuit 3, in which is disposed a transistor TR7, is inserted between and connected to the first transisterized circuit 1 and the second transisterized circuit 2.

In this embodiment, such a circuit performs the operation that is explained while referring to FIG. 1. The inversion circuit 3, in which is disposed the transistor TR7, inverts the base-emitter voltage Vbe that is changed in the first transisterized circuit 1, and transmits the resultant voltage to the second transisterized circuit 2. As a result, the base-emitter voltage Vbe change can be canceled.

When an operating voltage point in the circuit in FIG. 2 is so calculated that it does not saturate the base-collector in the coupled differential transisterized circuit of the second transisterized circuit 2 on the output side, the resistance encountered at the resistor R1 is represented by expression:

$$R_1=(V4-VS)/I_1.$$

Therefore, not only can a change in the base-emitter voltage Vbe of the transistor be canceled, but also, so long as target bias voltages and currents (V4, VS and $I_1$) are determined, the operating voltage point in the transisterized circuit can be stabilized merely by calculating a constant value for the resistor R1.

Figure 3:
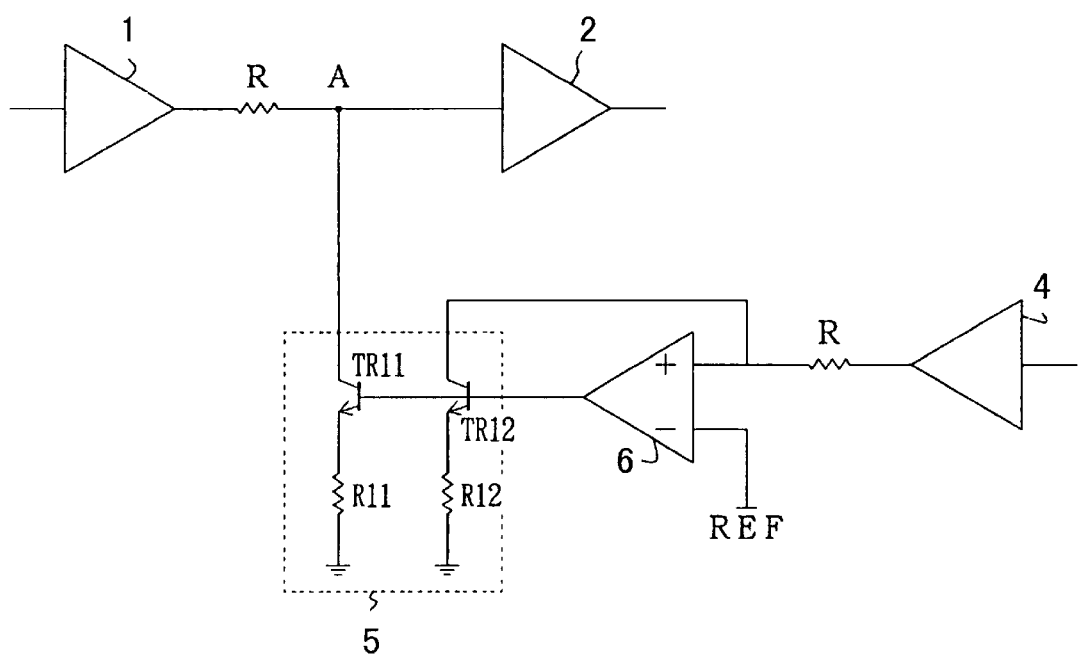
FIG. 3 is a diagram for explaining a second embodiment of the present invention.

FIG. 3 is a diagram illustrating a second embodiment for explaining the configuration used to compensate for an operating voltage point that is varied due to a voltage change. More specifically, a cascade connection of a first transisterized circuit 1 and a second transisterized circuit 2 compensates a fluctuation, due to a voltage change, at an operating voltage point at a connection point A of the first transisterized circuit1 and the second transisterized circuit 2.

A resistor R and a constant current supply 5 are connected to the output side of the first transisterized circuit 1. The constant-current source 5 has a first constant-current supply circuit, including a transistor TR11 and a resistor R11, that is connected to the resistor R on the output side of the first transisterized circuit 1. In addition, the constant current supply 5 includes a second constant-current supply circuit, constituted by a resistor R12 and a transistor TR12 that is connected to a voltage change detection circuit 4.

A comparison circuit 6, for comparing a voltage with a reference voltage REF, is provided between the resistor R, which is connected to the voltage change detection circuit 4, and the second constant-current supply circuit. The comparison circuit 6 so controls the potential between the resistor R, which is connected to the voltage change detection circuit 4, and the second constant-current supply circuit that it equals the reference voltage REF.

Therefore, a current consonant with the output of the comparison circuit 6 flows across the second constant-current supply circuit that is constructed by employing the transistor TR12 and the resistor R12. Further, since the output current of the comparison circuit 6 is maintained as constant, the constant current accordingly flows across the second constant current supply circuit.

The second constant current supply circuit, which includes the transistor TR12 and the resistor R12, together with the first constant circuit, which includes the transistor TR11 and the resistor R11, constitute a mirror circuit. With this arrangement, the same current as that which flows across the second constant-current supply circuit flows across the first constant-current supply circuit. Therefore, an operating potential at the output point A in the first transisterized circuit 1 is so maintained that it is substantially constant. As a result, it is possible to compensate for the voltage change and the temperature change.

Figure 4:
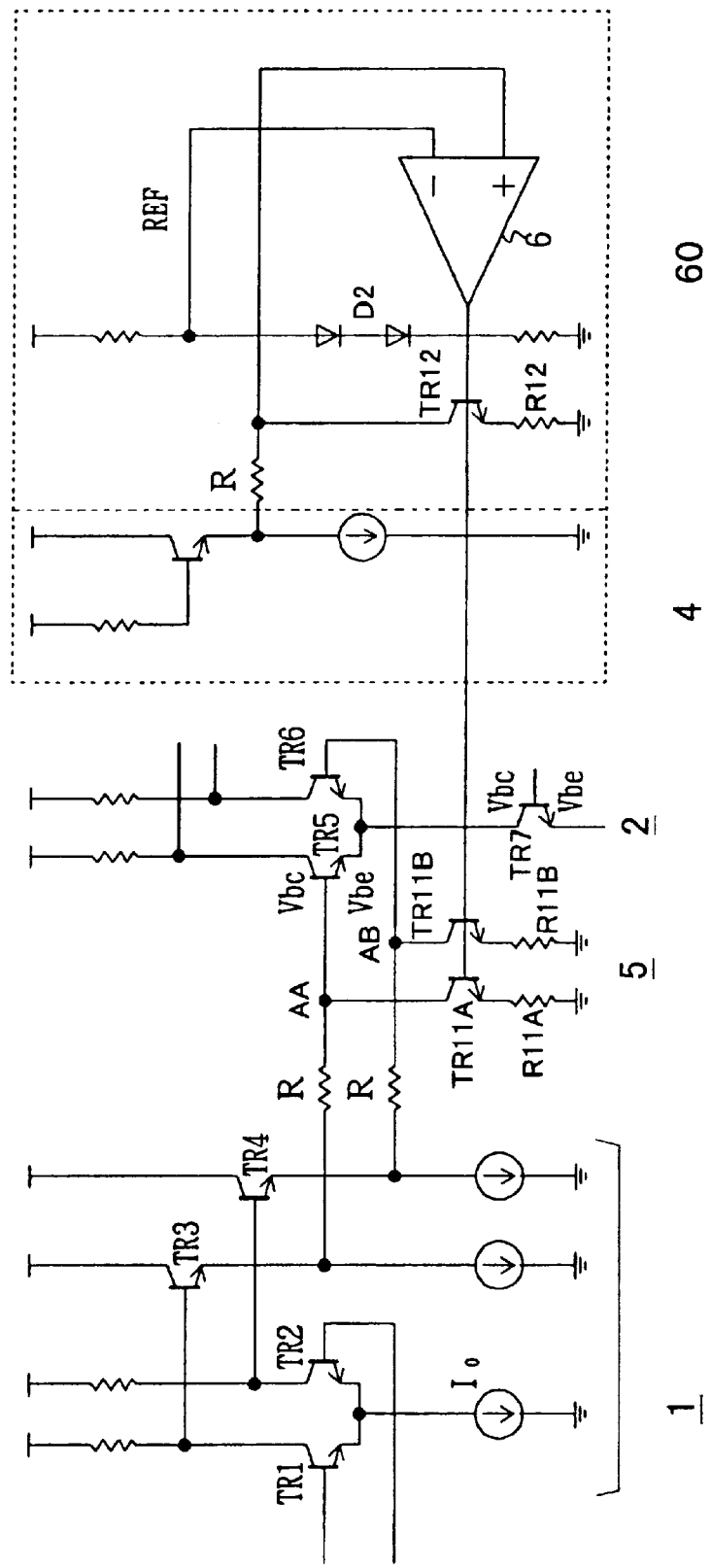
FIG. 4 is a specific circuit diagram illustrating the embodiment shown in FIG. 3.
Figure 5:
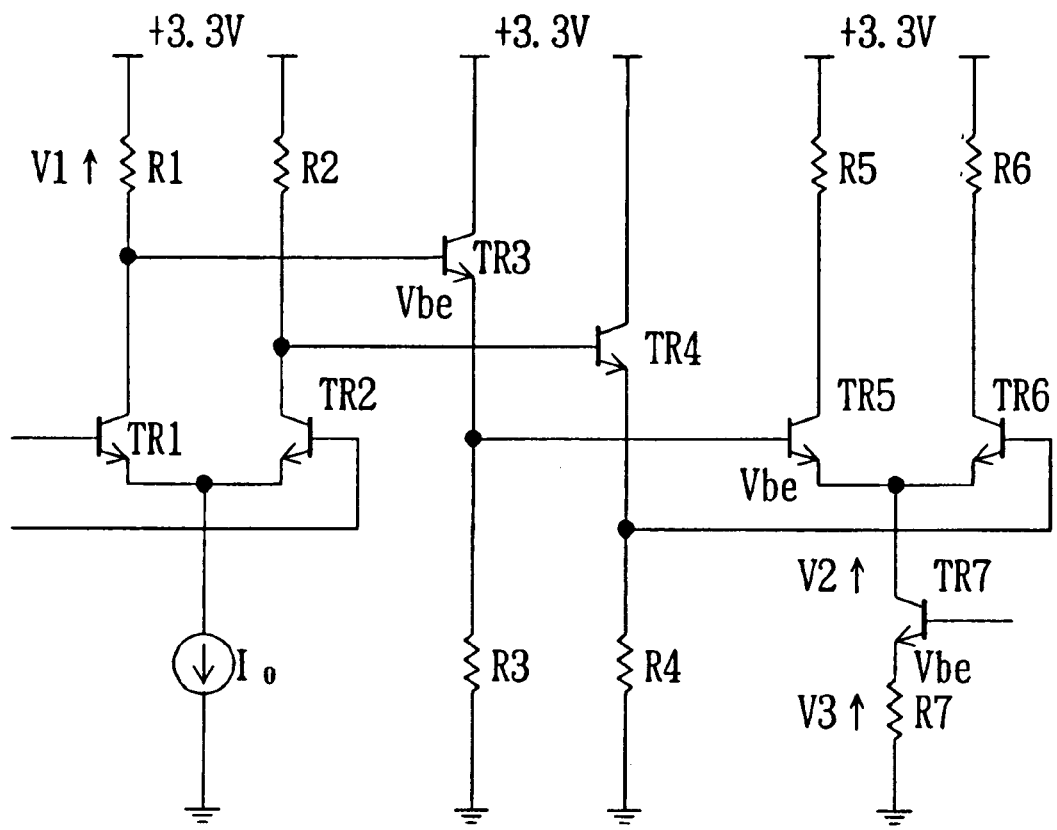
FIG. 5 is a circuit diagram of conventional cascade connections for coupled differential transistors and emitter followers.

FIG. 4 is a circuit diagram for the second embodiment shown in FIG. 3 for compensating for a change at an operating voltage point due to a voltage fluctuation. In the circuit in FIG. 4, a first transisterized circuit 1 is constituted by a coupled differential transistor circuit, in which differential transistors TR1 and TR2 are coupled together, and an emitter follower circuit, in which transistors TR3 and TR4 are respectively connected to the collectors of the coupled differential transistors TR1 and TR2.

Further, a second transisterized circuit 2, constituted by coupled differential transistors TR5 and TR6 and a constant-current source transistor TR7, is connected to the output sides of resistors R, which are respectively connected to emitter follower transistors TR3 and TR4.

In order to compensate for the operating voltage point s at connections AA and AB for the resistors R and the second transisterized circuit 2, a circuit constituted by a transistor TR11A and a resistor R11A is connected at the point AA, and a circuit constituted by a transistor TR11B and a resistor R11B are connected at the point AB. These circuits correspond to the circuit constituted by the transistor TR11 and the resistor R11 in the constant-current source 5 in FIG. 3.

In the constant-current source 5 in FIG. 3, the circuit constituted by the transistor TR11 and the resistor R11, and the mirror circuit constituted by the transistor TR12 and the resistor R12 are included in a reference generator 60 shown in FIG. 4.

The reference generator 60 includes a comparison circuit 6, wherein a reference voltage Vref is input at one of the input terminals, and the other input terminal is connected via a resistor R to a voltage change detection circuit 4. The output of the comparison circuit 6 is employed to maintain a constant current in a circuit that includes a transistor TR12 and a resistor R12.

A constant current flows across the circuit constituted by the transistor TR12 and the resistor R12 as well as across the mirror circuit constituted by the transistor TR11A and the resistor R11A, which are connected to the point AA, and across the circuit constituted by the transistor TR11B and the resistor R11B, which are connected to the point AB.

The operating voltage point potentials at the points AA and AB may become constant, and the change in the voltage can be compensated for.

In FIG. 4, a voltage that is acquired from a forward drop voltage of diodes D2 or a zener voltage of zener diodes $D_Z$ (not shown in FIG. 4) is used as the reference voltage Vref. Therefore, by applying the reference voltage Vref, a voltage change can be canceled, or a temperature characteristic can be provided.

In the embodiment shown in FIG. 4, a reference voltage Vref consonant with a change in the base-emitter voltage Vbe of a transistor can be generated. The base-collector voltages of the transistors TR5 and TR6 can be acquired, the base potentials of the transistors TR3 and TR4 can be reduced, and large base-collector amplitudes can be obtained.

The embodiments of the present invention have been explained while referring to the diagrams. By applying the operating voltage point compensation circuit of the present invention, a circuit constituted by the cascade connection of the emitter followers and the coupled differential transistor circuits can provide a stable operation, even though it is driven at a low voltage.

The above described embodiments are provided only for the explanation of the present invention. The scope of the present invention is not limited to these embodiments, it is defined by the attached claims. Other techniques that are the equivalent of those specified in the claims also fall within the scope of the present invention.

What is claimed is:

1. An operating voltage point compensation circuit for a transistor circuit, comprising:

a power supply voltage;

a first transistor circuit supplied with the power supply voltage;

a second transistor circuit, supplied with the sower supply voltage connected to an output side of said first transistor circuit;

a voltage change detection circuit providing an output corresponding to a voltage change of the power supply voltage;

a comparison circuit coupled to the voltage change detection circuit and comparing the output of said voltage change detection circuit with a reference voltage; and a current supply circuit connected to the comparison circuit, the voltage change detection circuit, and a connection point of said first transistor circuit and said second transistor circuit, and supplied with an output of the comparison circuit and with the output of the voltage chance detection circuit, said current supply circuit supplying to the connection point a constant current in consonance with the output of said comparison circuit.

2. An operating voltage point compensation circuit for a transistor circuit, comprising:

a power supply voltage;

a first transistor circuit supplied with the power supply voltage;

a second transistor circuit, supplied with the power supply voltage and connected to an output side of said first transistor circuit;

a voltage change detection circuit providing an output corresponding to a voltage change of the power supply voltage;

a comparison circuit comparing the output of said voltage change detection circuit with a reference voltage; and a current supply circuit connected to a connection point of said first transistor circuit and said second transistor circuit, and supplied with an output of the comparison circuit, said current supply circuit supplying to the connection point a constant current in consonance with the output of said comparison circuit, wherein said first transistor circuit includes a first coupled differential transistor circuit and an emitter follower circuit connected thereto, and said second transistor circuit includes a second coupled differential transistor circuit.

3. The operating voltage point compensation circuit according to claim 1, wherein said reference voltage is generated by means including zener diodes to which a power voltage is supplied.

4. An operating voltage point compensation circuit for a transistor circuit, comprising:

a power supply voltage;

a first transistor circuit supplied with the power supply voltage;

a second transistor circuit, supplied with the power supply voltage and connected to an output side of said first transistor circuit;

a voltage change detection circuit providing an output corresponding to a voltage change of the power supply voltage;

a comparison circuit comparing the output of said voltage change detection circuit with a reference voltage; and a current supply circuit connected to a connection point of said first transistor circuit and said second transistor circuit, and supplied with an output of the comparison circuit, said current supply circuit supplying to the connection point a constant current in consonance with the output of said comparison circuit, wherein said current supply circuit constitutes a mirror circuit having a first transistor connected to the connection point of said first and second transistor circuits, and a second transistor having a base connected in common to a base of said first transistor, and the bases of the first and second transistors are supplied with an output of said comparison circuit.

* * * * *